(12) United States Patent
Petrovic et al.

(10) Patent No.: US 10,868,642 B1
(45) Date of Patent: Dec. 15, 2020

(54) METHOD AND SYSTEM FOR EARLY PASS/FAIL DETERMINATION

(71) Applicant: Rohde & Schwarz GmbH & Co. KG, Munich (DE)

(72) Inventors: Niels Petrovic, Munich (DE); Jose Fortes, Madrid (ES); Edwin Menzel, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/577,813

(22) Filed: Sep. 20, 2019

(51) Int. Cl.
*H04L 1/24* (2006.01)
*G01R 29/10* (2006.01)
*H04B 5/00* (2006.01)

(52) U.S. Cl.
CPC .............. *H04L 1/24* (2013.01); *G01R 29/105* (2013.01); *H04B 5/0043* (2013.01)

(58) Field of Classification Search
CPC ........ H04L 1/24; G01R 29/105; H04B 5/0043
See application file for complete search history.

(56) References Cited

U.S. PATENT DOCUMENTS

| | | | | |
|---|---|---|---|---|
| 9,116,232 B2 * | 8/2015 | Goel | ................ | H04B 17/318 |
| 10,523,801 B1 * | 12/2019 | Rowell | ................ | H04M 1/24 |
| 2009/0153158 A1 * | 6/2009 | Dunn | ................ | G01R 31/2822 |
| | | | | 324/762.01 |
| 2016/0233970 A1 * | 8/2016 | Reed | ................ | H04B 17/29 |
| 2018/0321292 A1 * | 11/2018 | Bartko | ................ | G01R 29/0821 |
| 2018/0340975 A1 * | 11/2018 | Herbrig | ................ | G01R 29/0821 |
| 2019/0212386 A1 * | 7/2019 | Rowell | ................ | G01K 17/08 |

FOREIGN PATENT DOCUMENTS

| | | |
|---|---|---|
| EP | 1 253 737 A1 | 10/2002 |
| EP | 1 383 257 A1 | 1/2004 |
| EP | 1 523 121 A1 | 4/2005 |
| EP | 1 382 151 B1 | 6/2005 |
| EP | 1 502 377 B1 | 8/2012 |
| EP | 1 552 716 B1 | 4/2013 |
| WO | 2004036945 A1 | 4/2004 |

* cited by examiner

*Primary Examiner* — Lewis G West
(74) *Attorney, Agent, or Firm* — Ditthavong & Steiner P.C.

(57) ABSTRACT

A system for near-field measurement of a device under test in a far-field environment is provided. The system comprises a communication unit adapted to establish a far-field connection with the device under test. The system further comprises a measuring unit adapted to measure a magnitude and a phase of at least two field components. Moreover, the system comprises a processing unit adapted to perform far-field to near-field and/or near-field to near-field transformation of the field components in order to calculate field components at a specific surface in the near-field of the device under test.

20 Claims, 5 Drawing Sheets

METHOD AND SYSTEM FOR EARLY PASS/FAIL DETERMINATION

TECHNICAL FIELD

The invention relates to early pass/fail determination in over the air (OTA) measurements, especially for three-dimensional (3D) spherical OTA measurements.

BACKGROUND ART

Generally, spherical OTA measurements require measurements over many measurement grid points, even up to several hundreds or thousands grid points, in order to get a final result. All measurement grid points are needed to be measured to assure that an amount of all measurement points is either above or below a certain limit or threshold. Such pass/fail type of tests are required for a wide variety of test procedures such as conformance tests, production tests etc. and the pass/fail criteria can be based on manufacturer's decision or can be set according to the communication standards. However, in order to cover all the measurement grid points, the device under test (DUT) is required to be repositioned inside the OTA chamber during the measurement.

Furthermore, manual reposition of the DUT is also required in this case since several grid points are obstructed by the positioning system of the OTA chamber itself. The repositioning of the DUT can introduce additional errors and issues with repeatability and reproducibility of the measurements as well as with the reliability of the measurement system. Moreover, the measurements take a long time, especially when repositioning the DUT several times, depending on the number of measurement grid points and the required number of user interactions. The overall measurement time can be reduced, for instance by using lesser amount of measurement points and thereby predicting for the rest of the measurement.

Such a test method with an improved pass/fail determination regarding time delay error ratio is known from the document WO 2004/036945 A1 for example. However, in the case of spherical OTA measurement, a reduction in the total number of measurement points drastically affects the measurement reliability.

Accordingly, there is a need to provide a method and a system for early pass/fail determination, especially in spherical OTA measurements, in order to reduce the overall measurement time to come to a measurement verdict.

SUMMARY OF THE INVENTION

According to a first aspect of the invention, a method for early pass/fail determination in over the air measurements is provided. The method comprises the step of initiating a communication test with a defined pass/fail criteria on a device under test. In addition, the method comprises the step of arranging the device under test at a predefined number of positions. Moreover, the method comprises the step of terminating the communication test as soon as a number of reference positions with respect to the predefined number of positions has been reached in order to determine whether the communication test is passed or failed. In this context, the reference positions and the predefined positions correspond to measurement points on a spherical grid.

Therefore, instead of carrying out the measurement for all the measurement grid points, the measurement is stopped early by using an early pass/fail criterion. Furthermore, as an alternative to the reduction of total number of measurement points, the number of measurement grid points required to come to a measurement verdict are reduced. Advantageously, the overall measurement time is significantly reduced while maintaining a high measurement reliability.

In addition, due to the reduced number of measurement grid points, the DUT is required to be manually repositioned a very few times or no times at all. As a result, the source for additional errors is considerably reduced thereby improving measurement repeatability and reproducibility.

According to a first preferred implementation form of said first aspect of the invention, the method further comprises the step of defining the number of reference positions based on the pass/fail criteria of the communication test. Therefore, the number of reference positions can be defined based on a single criterion or a set of criteria depending on the type of communication test. In other words, the number or percentage amount of reference points with respect to the total number of measurement points is defined based on the pass/fail criteria of a specific communication test.

According to a second preferred implementation form of said first aspect of the invention, the pass/fail criteria include a definite threshold specific to the communication test and wherein the method further comprises the step of evaluating the reference positions with respect to the threshold. Advantageously, the measurement verdict is reached in a simplified manner with a high accuracy.

According to a further preferred implementation form of said first aspect of the invention, the method further comprises the step of measuring the device under test at least for downlink capabilities. Thus, the downlink of the DUT is tested with respect to the communication test.

According to a further preferred implementation form of said first aspect of the invention, the method further comprises the step of measuring the device under test at least for uplink capabilities. Advantageously, the uplink of the DUT is tested with respect to the communication test.

According to a further preferred implementation form of said first aspect of the invention, the method further comprises the step of measuring the device under test for both downlink and uplink capabilities. Therefore, both downlink and uplink of the DUT are tested with respect to the communication test, which results in a high measurement flexibility.

According to a further preferred implementation form of said first aspect of the invention, the method further comprises the step of moving the device under test to the predefined number of positions while the communication test is being conducted. As a result, the DUT is tested in a continuous manner.

According to a second aspect of the invention, a system for early pass/fail determination in over the air measurements is provided. The system comprises a measuring unit comprising a link antenna and a measurement antenna, adapted to initiate a communication test with a defined pass/fail criteria on a device under test. The system further comprises a three-dimensional positioner adapted to arrange the device under test at a predefined number of positions.

In this context, the measuring unit is further adapted to terminate the communication test as soon as a number of reference positions with respect to the predefined number of positions has been reached in order to determine whether the communication test is passed or failed. Advantageously, the standard OTA measurement procedure is optimized by using an early pass/fail criterion in order to decide the measurement outcome.

According to a first preferred implementation form of said second aspect of the invention, the reference positions and the predefined positions correspond to measurement points on a spherical grid. Hence, 3D spherical OTA measurements are advantageously incorporated.

According to a second preferred implementation form of said second aspect of the invention, the measuring unit is further adapted to define the number of reference positions based on the pass/fail criteria of the communication test. In other words, the number or percentage amount of reference points with respect to the total number of measurement points is defined based on the pass/fail criteria of a specific communication test.

According to a further preferred implementation form of said second aspect of the invention, the pass/fail criteria include a definite threshold specific to the communication test and wherein the measuring unit is further adapted to evaluate the reference positions with respect to the threshold. Advantageously, the measurement verdict is reached in a simplified manner with a high accuracy.

According to a further preferred implementation form of said second aspect of the invention, the measuring unit is further adapted to measure the device under test at least for downlink capabilities. Advantageously, the downlink of the DUT is tested with respect to the communication test.

According to a further preferred implementation form of said second aspect of the invention, the measuring unit is further adapted to measure the device under test at least for uplink capabilities. Hence, the uplink of the DUT is tested with respect to the communication test.

According to a further preferred implementation form of said second aspect of the invention, the measuring unit is further adapted to measure the device under test for both downlink and uplink capabilities. Advantageously, both downlink and uplink of the DUT are tested with respect to the communication test, which results in a high measurement flexibility.

According to a further preferred implementation form of said second aspect of the invention, the measuring unit is further adapted to measure the device under test for all of the predefined number of positions. Advantageously, measurement accuracy and reliability are further improved.

According to a further preferred implementation form of said second aspect of the invention, the system further comprising a positioning unit adapted to control the three-dimensional positioner. In this context, the positioning unit, by means of the three-dimensional positioner, is further adapted to move the device under test to the predefined number of positions while the communication test is being conducted. Advantageously, uninterrupted testing of the DUT is realized in a simplified manner.

According to a further preferred implementation form of said second aspect of the invention, the system further comprising a shaped reflector in order to facilitate indirect far-field measurement of the device under test. Hence, OTA testing of the DUT is advantageously performed in a compact test environment.

According to a further preferred implementation form of said second aspect of the invention, the system further comprising an anechoic chamber encompassing the device under test, the three-dimensional positioner, the link antenna, the measurement antenna and the shaped reflector. Advantageously, measurement reliability is further improved due to, for instance the standing wave reduction capability of the anechoic chamber.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
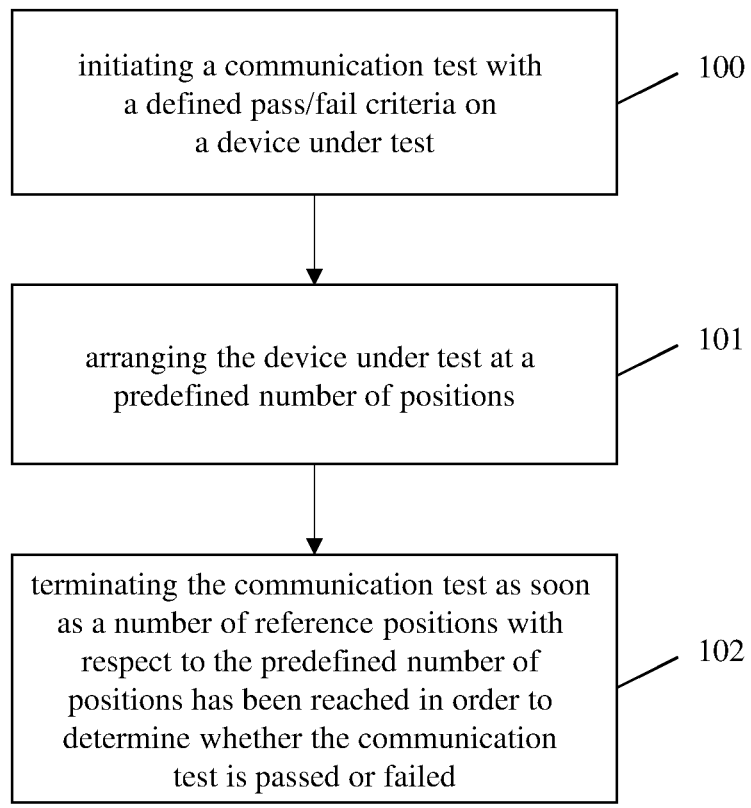
FIG. 1 shows an exemplary embodiment of the method according to the first aspect of the invention.

In FIG. 1, an exemplary embodiment of the method according to the first aspect of the invention is illustrated. In a first step 100, a communication test is initiated on a device under test with a defined pass/fail criteria. In a second step 101, the device under test is arranged at a predefined number of positions. In a third step 102, the communication test is terminated as soon as a number of reference positions with respect to the predefined number of positions has been reached in order to determine whether the communication test is passed or failed. In this context, the reference positions and the predefined positions correspond to measurement points on a spherical grid.

In addition to this, the method further comprises the step of defining the number of reference positions based on the pass/fail criteria of the communication test.

It might be further advantageous if the pass/fail criteria include a definite threshold specific to the communication test and the method further comprises the step of evaluating the reference positions with respect to the threshold.

Moreover, the method further comprises the step of measuring the device under test at least for uplink capabilities, or at least for downlink capabilities or for both downlink and uplink capabilities.

In addition, the method further comprises the step of moving the device under test to the predefined number of positions while the communication test is being conducted.

Figure 2:
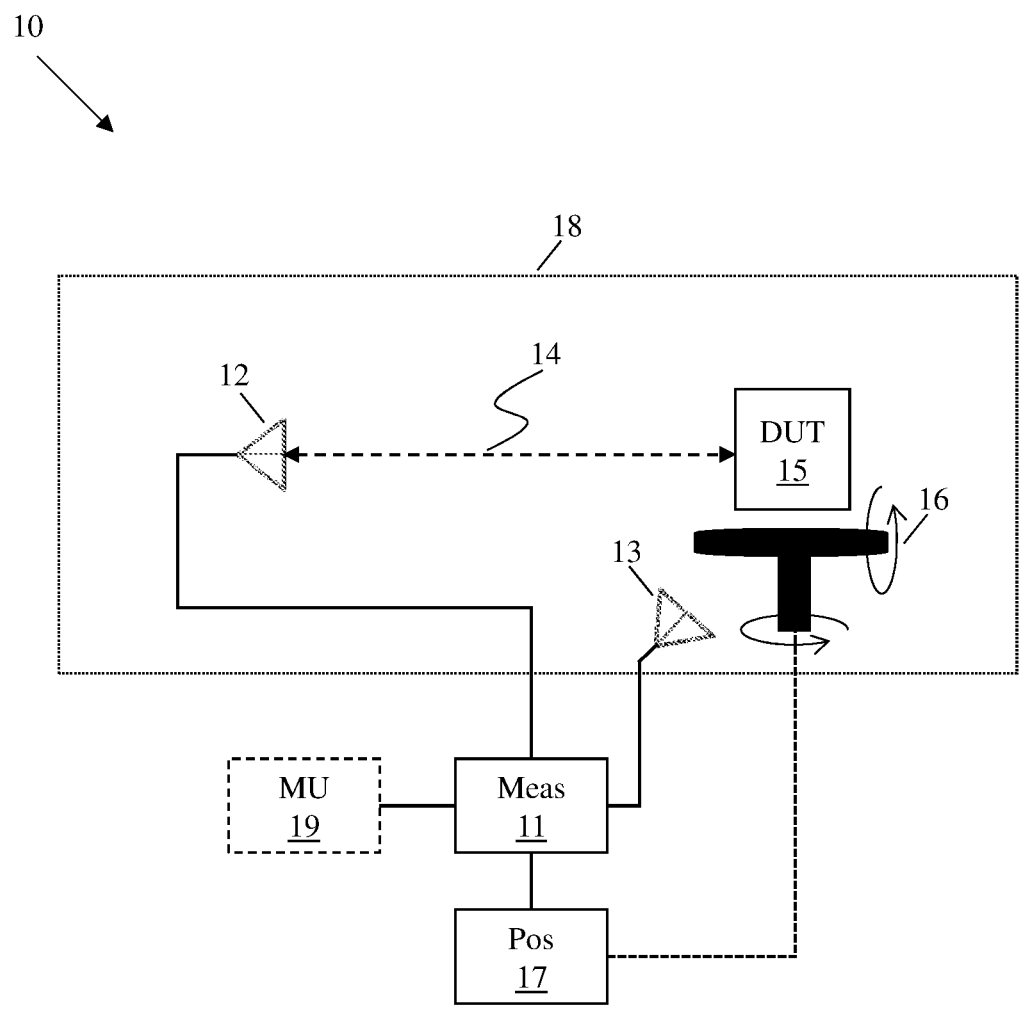
FIG. 2 shows a first exemplary embodiment of the system according to the second aspect of the invention.

In FIG. 2, a first exemplary embodiment of the system 10 according to the second aspect of the invention is illustrated. The system 10 preferably corresponds to an OTA test setup, for instance facilitating a near-field measurement or direct far-field measurement based on the type of devices to be tested, the nature of the measurement and the testing frequency range. The system 10 comprises a measuring unit 11 including a link antenna 12 and a measurement antenna 13 in order to perform OTA testing on a device under test (DUT) 15. The DUT 15 can be a wireless module, a mobile device, an antenna, an antenna array and the like. The measuring unit 11 initiates communication 14 with respect to the DUT 15 through the link antenna 12, preferably for both downlink and uplink establishment. In this context, the measuring unit 11 may also be referred to as a measurement device, a meter, an analyzer and the like. Such a measuring unit 11 generally comprises signal generating means, data/signal processing means and user/data interfaces, which are well-known in the art and are not described in detail to avoid unnecessarily obscuring the invention.

Hence, the DUT 15 can be tested for both downlink and uplink characteristics, for instance the radiated transmission performance (e.g., total radiated power), reception performance (e.g., total isotropic sensitivity) and so on. The measurement antenna 13 is located at the near-field (in the case of near-field measurements) or at the radiated far-field (in the case of far-field measurement) of the DUT 15. The measuring unit 11 performs measurement on the DUT 15 based on a specific communication test, preferably a pass/fail type of test according to, for example conformance testing, production testing etc. Ideally, such a pass/fail type of test has a definite criterion with respect to the communication test to be conducted. The pass/fail criteria can be based on a single pass/fail condition or a set of criteria specific to a measurement quantity or a combination of quantities corresponding to the nature of the communication test.

The system 10 further comprises a positioner 16, preferably a 3D positioner on which the DUT 15 is arranged in order to orient the DUT 15 in the polar coordinate system, especially with respect to the azimuth and elevation direction of the antennas 12, 13. Normally, the positioner 16 is designed in such manner that it has extremely low influence on the DUT radiated fields. It is to be noted that the positioner 16 may not be able to cover full spherical measurements of the DUT 15. Therefore, the DUT 15 is required to be repositioned (e.g., flipped) in order to cover the full sphere. However, due to the reduced number of measurement points required to arrive at the test judgement, such repositioning of the DUT 15 is considerably minimized thereby reducing its adverse impact on the measurements.

The positioner 16 is connected to a positioning unit 17, which is further connected to the measuring unit 11. The positioning unit 17 controls the positioner 17 in order to move the DUT 15 to a predefined number of test positions, for instance based on a set of control commands generated by a user through the measuring unit 11. In this context, the positioning unit 17 may also be referred to as a position controller or a controller, which can be an integrated module of the measuring unit 11. Alternatively, the positioning unit 17 can be a separate entity connected to the measuring unit 11 wirelessly or conductively.

The system 10 may optionally comprise a memory unit 19, connected to the measuring unit 11. The memory unit can thereby store the measured quantities, programs required for data/signal processing and may temporarily store input and output information. The system also comprises an anechoic chamber 18 in order to facilitate OTA test environment for the DUT 15. The anechoic chamber 18 encompasses the DUT 15 and the positioner 16 along with the antennas 12, 13.

Figure 3:
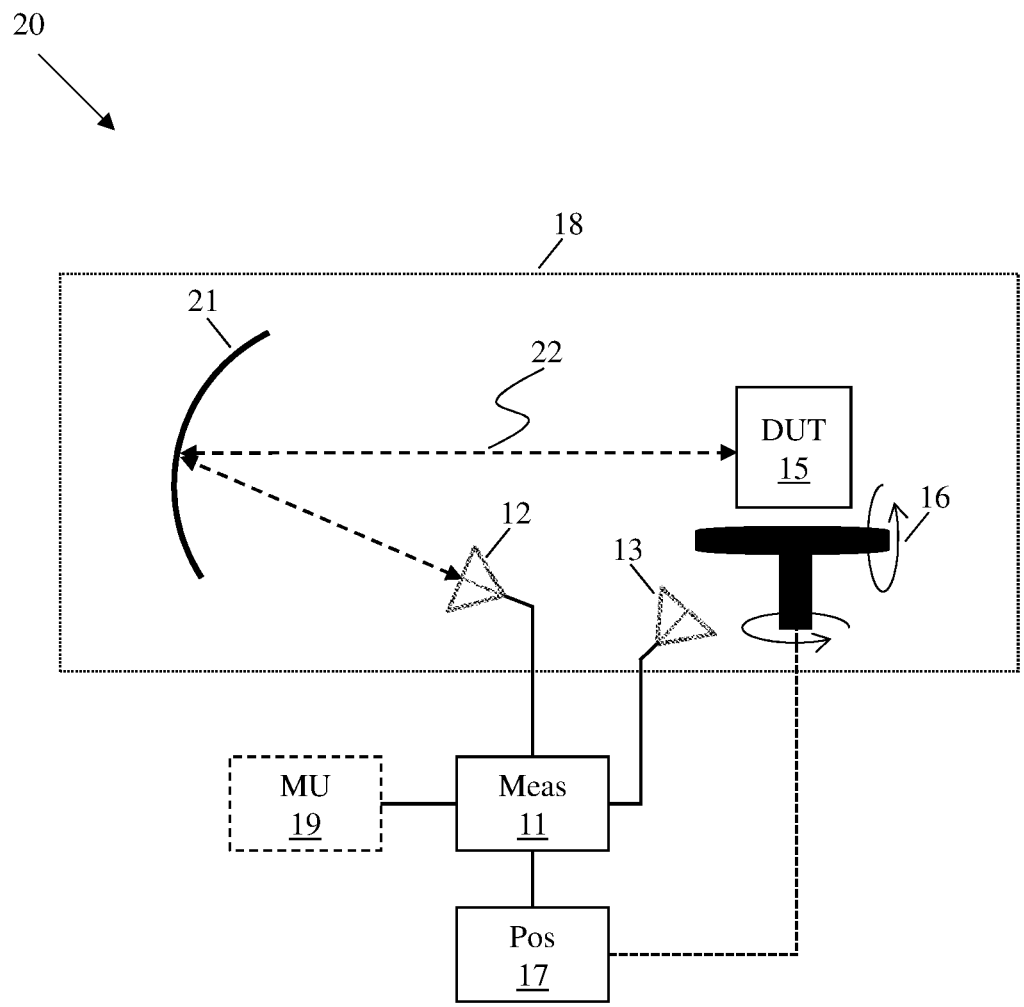
FIG. 3 shows a second exemplary embodiment of the system according to the second aspect of the invention.

In FIG. 3, a second exemplary embodiment of the system 20 according to the second aspect of the invention is illustrated. The system 20 differs from the system 10 of FIG. 1 in that it comprises a reflector 21, preferably a shaped reflector within the anechoic chamber 18 in order to emulate indirect far-field test environment for the DUT 15, for instance in a way similar to the Compact Antenna Test Range (CATR) systems. As such, the measuring unit 11 is configured to establish indirect far-field link 22 with respect to the DUT 15 through the link antenna 12 and performs measurement through the measuring antenna 13 for both downlink and uplink.

Figure 4:
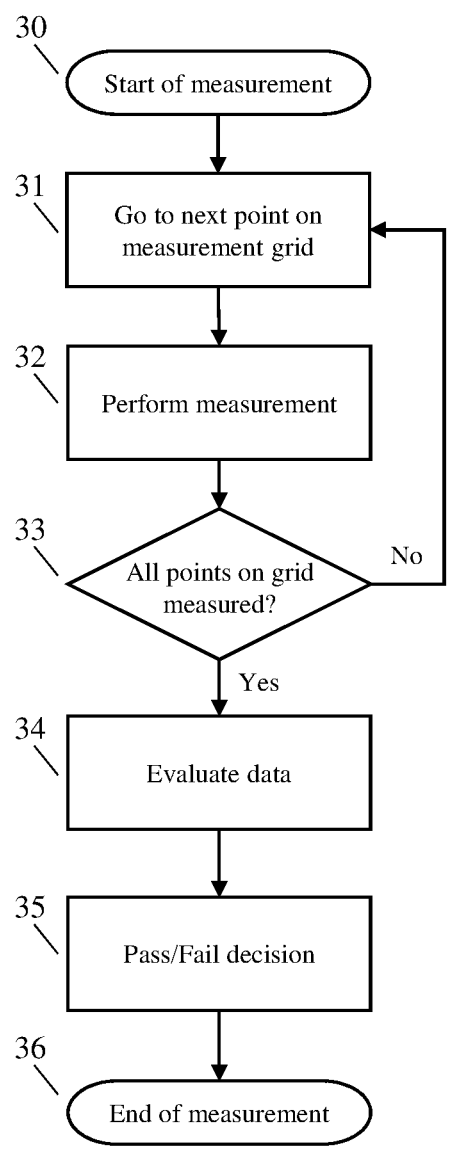
FIG. 4 shows a flow diagram of a standard pass/fail test method by way of an example.

In FIG. 4, a flow diagram of a standard pass/fail test method is illustrated by way of an example. Upon initiating the test, the device to be tested is moved 31 to a variety of test points on the measurement grid. At each test point on the grid, the required performance characteristics of the device is measured 32, generally via measurement probes or sensors or stand-alone measurement devices. Here the process checks 33 whether the device is measured for the entire measurement grid or not. If all test points are not investigated, the device is further moved 31 to the residual test points and further measurements 32 are performed.

After collecting measurement data for all test points on the grid, the data are evaluated 34 with respect to a specific pass/fail criterion according to the nature of the test. A decision 35 is made whether the device passed or failed the test based on the evaluation of the measurement data. Upon arriving at a verdict, the measurement is terminated 36.

Figure 5:
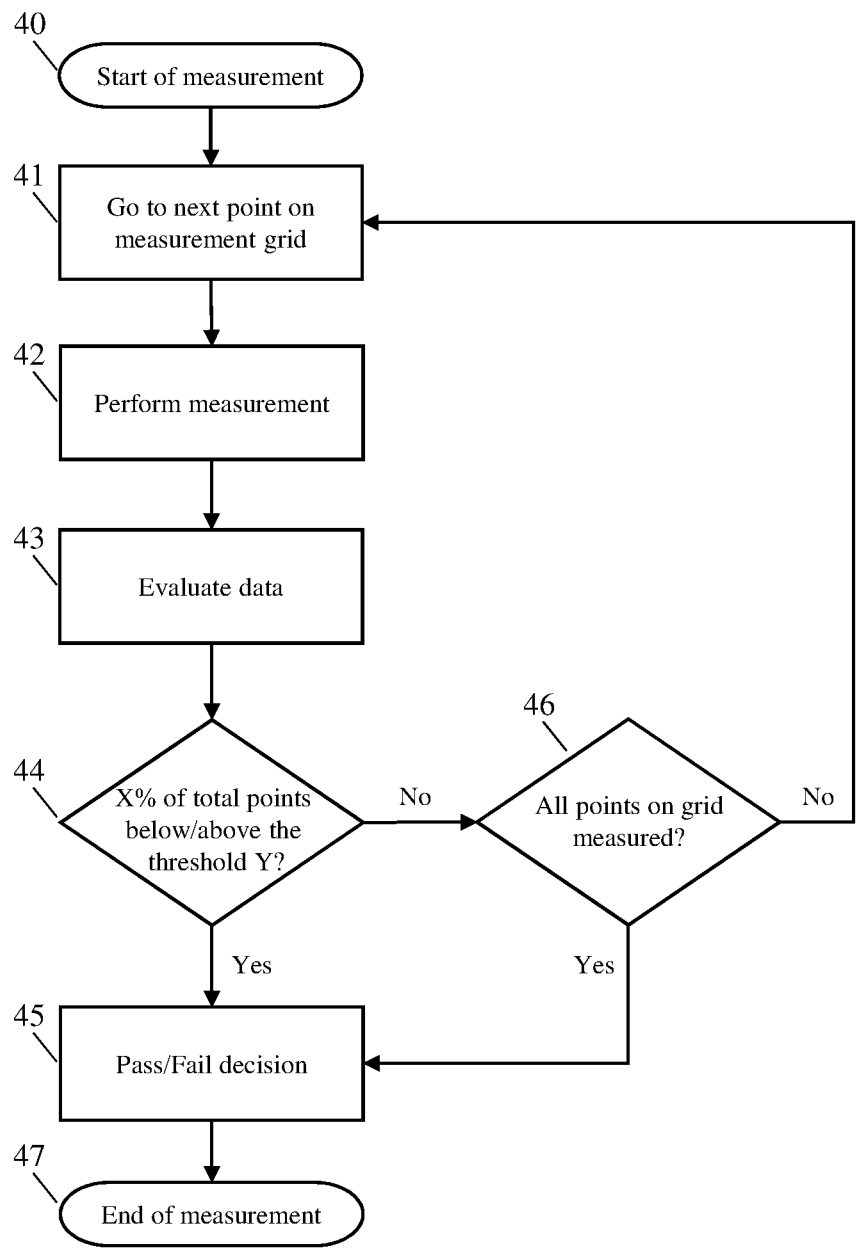
FIG. 5 shows a flow diagram of the inventive early pass/fail test method by way of an example.

In FIG. 5, a flow diagram of the inventive early pass/fail test method is illustrated by way of an example. Upon initiating 40 the test, the DUT 15 is moved 41 to a predefined measurement points on the spherical grid and is measured 42 for performance characteristics, in an analogous way to the standard pass/fail test method. However, in contrast to the standard method, the measurement data are evaluated 43 alongside with the measurements with respect to specific pass/fail criteria 44 of the test. Herein, the data evaluation is based on a reference number of test points required to come to a test verdict 45. For example, the reference number of test points may be an amount (e.g., X %) of all predefined measurement grid points and are compared with respect to a threshold (e.g., a certain limit Y) in order to identify whether the X % of measurement grid points are above or below the limit Y.

In case the amount of measurement points are not adequate to reach the test judgement, the DUT 15 is further measured at the consecutive measurement points as defined on the grid beforehand until all of the measurement points are investigated 46. As a result, an early pass/fail criterion is introduced within the standard pass/fail test method, which advantageously reduces the number of measurement grid points required to come to the test verdict. The test is immediately terminated 47 upon reaching to the verdict even if all of the measurement grid points are not investigated.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for early pass/fail determination in over the air measurements comprises the steps of:
   initiating a communication test with a defined pass/fail criteria on a device under test,
   arranging the device under test at a first predefined position inside a test chamber,
   repositioning the device under test at a number of further positions according to a polar coordinate system, with respect to the azimuth and elevation direction of antennas inside the test chamber during the over the air measurements, and
   terminating the communication test as soon as a number of reference positions with respect to the predefined number of positions has been reached in order to determine whether the communication test is passed or failed,
   wherein the device under test is measured at the predefined number of positions for performance characteristics and measurement data is evaluated with respect to a defined pass/fail criteria.

2. The method according to claim 1,
   wherein the reference positions and the predefined positions correspond to measurement points on a spherical grid.

3. The method according to claim 1,
   wherein the method further comprises the step of defining the number of reference positions based on the pass/fail criteria of the communication test.

4. The method according to claim 1,
   wherein the pass/fail criteria include a definite threshold specific to the communication test and wherein the method further comprises the step of evaluating the reference positions with respect to the threshold.

5. The method according to claim 1,
   wherein the method further comprises the step of measuring the device under test at least for downlink capabilities.

6. The method according to claim 1,
   wherein the method further comprises the step of measuring the device under test at least for uplink capabilities.

7. The method according to claim 1,
   wherein the method further comprises the step of measuring the device under test for both downlink and uplink capabilities.

8. The method according to claim 1,
   wherein the method further comprises the step of moving the device under test to the predefined number of positions while the communication test is being conducted.

9. A system for early pass/fail determination in over the air measurements comprising:
   a measuring unit comprising a link antenna and a measurement antenna, adapted to initiate a communication test with a defined pass/fail criteria on a device under test, and
   a three-dimensional positioner adapted to arrange the device under test at a first position inside a test chamber, wherein the three-dimensional positioner is further adapted for repositioning the device under test at a number of further positions according to a polar coordinate system, with respect to the azimuth and elevation direction of the antennas inside the test chamber during the over the air measurements,
   wherein the measuring unit is further adapted to terminate the communication test as soon as a number of reference positions with respect to the predefined number of positions has been reached in order to determine whether the communication test is passed or failed, and
   wherein the device under test is measured at the predefined number of positions for performance characteristics and the measurement data is evaluated with respect to a defined pass/fail criteria.

10. The system according to claim 9,
    wherein the reference positions and the predefined positions correspond to measurement points on a spherical grid.

11. The system according to claim 9,
    wherein the measuring unit is further adapted to define the number of reference positions based on the pass/fail criteria of the communication test.

12. The system according to claim 9,
    wherein the pass/fail criteria include a definite threshold specific to the communication test and wherein the measuring unit is further adapted to evaluate the reference positions with respect to the threshold.

13. The system according to claim 9,
    wherein the measuring unit is further adapted to measure the device under test at least for downlink capabilities.

14. The system according to claim 9,
    wherein the measuring unit is further adapted to measure the device under test at least for uplink capabilities.

15. The system according to claim 9,
    wherein the measuring unit is further adapted to measure the device under test for both downlink and uplink capabilities.

16. The system according to claim 9,
    wherein the measuring unit is further adapted to measure the device under test for all of the predefined number of positions.

17. The system according to claim 9,
    wherein the system further comprises a positioning unit adapted to control the three-dimensional positioner.

18. The system according to claim 17,
    wherein the positioning unit, by means of the three-dimensional positioner, is further adapted to move the device under test to the predefined number of positions while the communication test is being conducted.

19. The system according to claim 9,
    wherein the system further comprises a shaped reflector in order to facilitate indirect far-field measurement of the device under test.

20. The system according to claim 19,
    wherein the system further comprises an anechoic chamber encompassing the device under test, the three-dimensional positioner, the link antenna, the measurement antenna and the shaped reflector.

* * * * *